US012593490B2

(12) United States Patent

Nose

(10) Patent No.: US 12,593,490 B2

(45) Date of Patent: Mar. 31, 2026

(54) HEMT DEVICE WITH CRYSTALLINITY CONTROL FILM

(71) Applicant: Sumitomo Electric Device Innovations, Inc., Yokohama (JP)

(72) Inventor: Yukinori Nose, Yokohama (JP)

(73) Assignee: Sumitomo Electric Device Innovations, Inc., Kanagawa (JP)

( * ) Notice: Subject to any disclaimer, the term of this patent is extended or adjusted under 35 U.S.C. 154(b) by 667 days.

(21) Appl. No.: 17/940,111

(22) Filed: Sep. 8, 2022

(65) Prior Publication Data

US 2023/0094768 A1 Mar. 30, 2023

(30) Foreign Application Priority Data

Sep. 27, 2021 (JP) ................................. 2021-157037

(51) Int. Cl.
H01L 23/498 (2006.01)
G11C 5/06 (2006.01)
(Continued)

(52) U.S. Cl.
CPC ........... H10D 64/64 (2025.01); H10D 30/015 (2025.01); H10D 30/485 (2025.01); H10D 62/8503 (2025.01)

(58) Field of Classification Search
CPC ......... H10D 30/015; H10D 30/47–485; H10D 64/64; H10D 30/6738;
(Continued)

(56) References Cited

U.S. PATENT DOCUMENTS

2009/0242943 A1* 10/2009 Kawasaki ............ H10D 64/411
257/280
2010/0317164 A1* 12/2010 Komatani ......... H01L 21/28264
257/E21.403
(Continued)

FOREIGN PATENT DOCUMENTS

JP H11-238695 A 8/1999
JP 2008-306026 A 12/2008
(Continued)

*Primary Examiner* — Wael M Fahmy
*Assistant Examiner* — Aneesa Riaz Baig
(74) *Attorney, Agent, or Firm* — Volpe Koenig

(57) ABSTRACT

A semiconductor device includes a substrate, a semiconductor layer disposed on the substrate, an insulating layer disposed on the semiconductor layer and having a first opening formed therein, a gate electrode disposed on the insulating layer and in contact with the semiconductor layer via the first opening, and a source electrode and a drain electrode in ohmic contact with the semiconductor layer. The gate electrode includes a crystallinity control film disposed on the insulating layer and having a second opening formed such that an inner wall thereof extends to an inner wall of the first opening toward the substrate in plan view in a direction perpendicular to a top surface of the substrate, and a first metal film disposed on the crystallinity control film and in Schottky contact with the semiconductor layer via the inner walls, extending to each other, of the second opening and the first opening.

11 Claims, 14 Drawing Sheets

(51) Int. Cl.

| | |
|---|---|
| *H01L 21/768* | (2006.01) |
| *H01L 23/00* | (2006.01) |
| *H01L 23/495* | (2006.01) |
| *H10B 51/10* | (2023.01) |
| *H10B 51/20* | (2023.01) |
| *H10D 30/01* | (2025.01) |
| *H10D 30/47* | (2025.01) |
| *H10D 62/85* | (2025.01) |
| *H10D 64/64* | (2025.01) |
| *H10H 20/852* | (2025.01) |
| *H10H 20/857* | (2025.01) |

(58) Field of Classification Search

CPC .......... H10D 30/061–0616; H10D 30/87–877; H10D 84/0135; H10D 84/014; H10D 84/0142; H10D 84/0172; H10D 84/0177; H10D 84/0179; H10D 64/017; H10D 64/517; H10D 64/518; H10D 30/673; H01L 21/8252; H01L 21/8258; H01L 27/0605; H01L 21/28581; H01L 21/28114; H01L 21/28088

See application file for complete search history.

(56) References Cited

U.S. PATENT DOCUMENTS

| | | | |
|---|---|---|---|
| 2013/0082307 A1* | 4/2013 | Okamoto | H10D 8/60 257/E21.184 |
| 2013/0256755 A1* | 10/2013 | Kurachi | H10D 64/111 257/194 |
| 2014/0091424 A1* | 4/2014 | Makiyama | H10D 30/47 257/472 |
| 2017/0186860 A1* | 6/2017 | Wong | H10D 30/475 |
| 2019/0081154 A1* | 3/2019 | Watanabe | H01L 21/31144 |
| 2019/0207022 A1* | 7/2019 | Nagase | H10D 64/693 |
| 2019/0385859 A1* | 12/2019 | Nose | H10D 62/824 |
| 2021/0005741 A1* | 1/2021 | Otake | H10D 30/015 |
| 2022/0189780 A1* | 6/2022 | Kostelnik | H10D 64/64 |
| 2022/0310803 A1* | 9/2022 | Watanabe | H01L 21/31116 |
| 2024/0047567 A1* | 2/2024 | Hao | H10D 30/015 |
| 2024/0266428 A1* | 8/2024 | Kanda | H10D 30/6738 |

FOREIGN PATENT DOCUMENTS

| | | |
|---|---|---|
| JP | 2009-200306 A | 9/2009 |
| JP | 2013-207086 A | 10/2013 |
| JP | 2014-072391 A | 4/2014 |
| JP | 2019-216188 A | 12/2019 |

* cited by examiner

HEMT DEVICE WITH CRYSTALLINITY CONTROL FILM

CROSS REFERENCE TO RELATED APPLICATIONS

This application claims priority based on Japanese Patent Application No. 2021-157037 filed on Sep. 27, 2021, and the entire contents of the Japanese patent application are incorporated herein by reference.

TECHNICAL FIELD

The present disclosure relates to a semiconductor device and a method of manufacturing semiconductor devices.

BACKGROUND ART

There is a semiconductor device in which a gate electrode is in Schottky contact with a semiconductor layer. In this semiconductor device, an insulating layer is formed on a semiconductor layer in order to alleviate electric field concentration in the vicinity of a gate electrode, and a part of the gate electrode is provided on the insulating layer (PTL 1, PTL 2).

PTL 1: Japanese Unexamined Patent Application Publication No. 2013-207086

PTL 2: Japanese Unexamined Patent Application Publication No. 2019-216188

SUMMARY OF INVENTION

A semiconductor device according to the present disclosure includes a substrate, a semiconductor layer disposed on the substrate, an insulating layer disposed on the semiconductor layer and having a first opening formed therein, a gate electrode disposed on the insulating layer and in contact with the semiconductor layer via the first opening, and a source electrode and a drain electrode in ohmic contact with the semiconductor layer. The gate electrode includes a crystallinity control film disposed on the insulating layer and having a second opening formed such that an inner wall thereof extends to an inner wall of the first opening toward the substrate in plan view in a direction perpendicular to a top surface of the substrate, a first metal film disposed on the crystallinity control film and in Schottky contact with the semiconductor layer via the inner walls, extending to each other, of the second opening and the first opening, and a second metal film disposed on the first metal film and having a lower electrical resistance than the first metal film.

DESCRIPTION OF EMBODIMENTS

Figure 1:
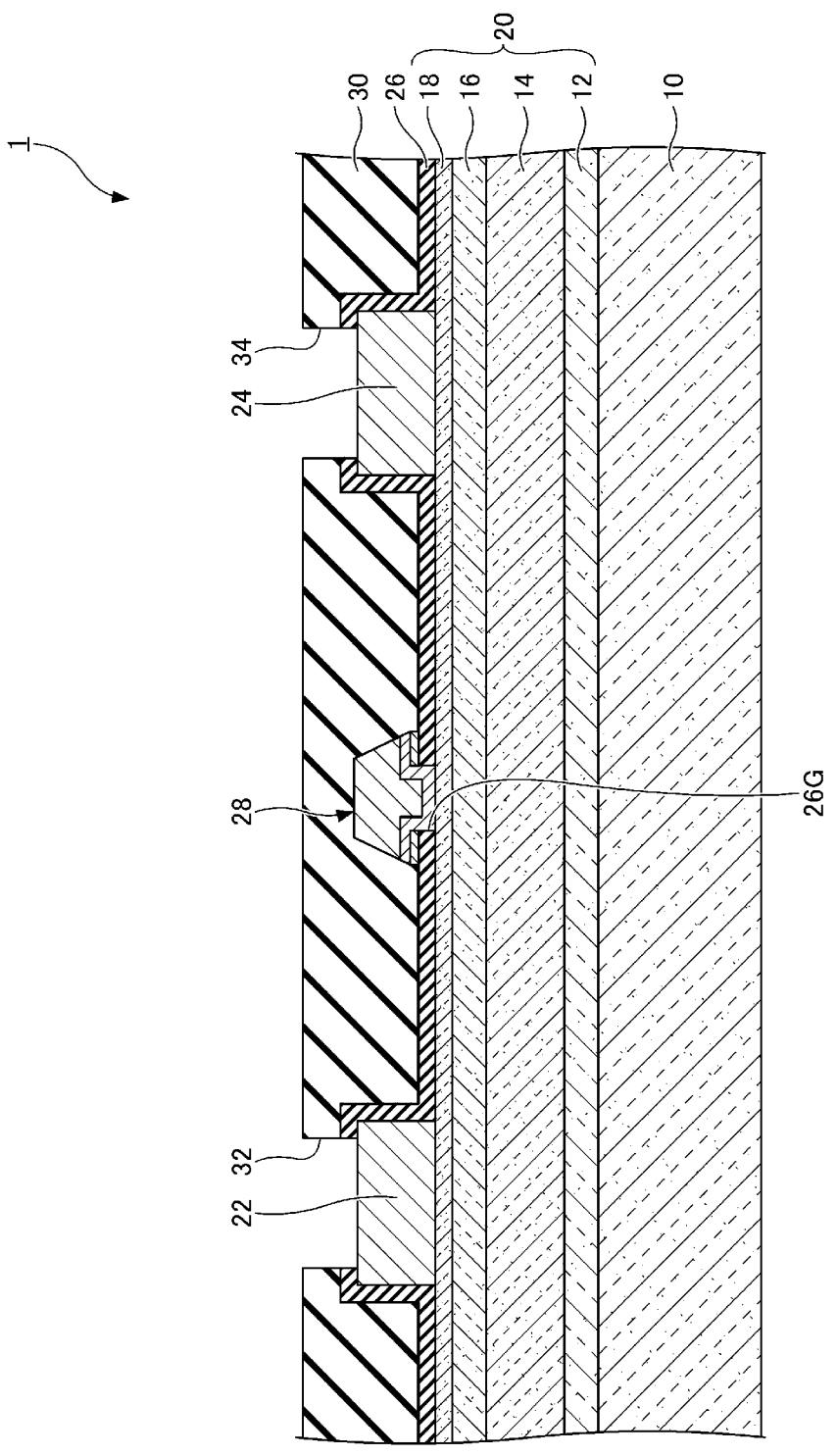
FIG. 1 is a cross-sectional view of a semiconductor device according to an embodiment.

According to the semiconductor devices described in PTL 1 and PTL 2, although an expected object is achieved, it is desired to reduce the resistance of a gate electrode in order to obtain higher characteristics.

The present disclosure provides a semiconductor device capable of reducing electrical resistance of a gate electrode, and a method of manufacturing the semiconductor device.

Description of Embodiments of Present Disclosure

First, embodiments of the present disclosure will be listed and described.

(1) A semiconductor device according to an aspect of the present disclosure includes a substrate, a semiconductor layer disposed on the substrate, an insulating layer disposed on the semiconductor layer and having a first opening formed therein, a gate electrode disposed on the insulating layer and in contact with the semiconductor layer via the first opening, and a source electrode and a drain electrode in ohmic contact with the semiconductor layer. The gate electrode includes a crystallinity control film disposed on the insulating layer and having a second opening formed such that an inner wall thereof extends to an inner wall of the first opening toward the substrate in plan view in a direction perpendicular to a top surface of the substrate, a first metal film disposed on the crystallinity control film and in Schottky contact with the semiconductor layer via the inner walls, extending to each other, of the second opening and the first opening, and a second metal film disposed on the first metal film and having a lower electrical resistance than the first metal film.

A first metal film is formed on the crystallinity control film, and the crystallinity of the first metal film is improved as compared with the case where the first metal film is formed on the insulating layer so as to be in contact with the insulating layer. Since the crystallinity of the second metal film is affected by the crystallinity of the first metal film, the crystallinity of the second metal film is also improved. Thus, the electrical resistance of the gate electrode can be reduced. By reducing the electrical resistance of the gate electrode, it is possible to reduce a loss of a signal input to the gate electrode and to reduce deterioration of a high-frequency gain. Therefore, characteristics and reliability of the semiconductor device can be improved.

(2) In (1), the semiconductor layer may include a nitride semiconductor layer. The first metal film may be a Ni film. The crystallinity control film may have an atomic arrangement with six-fold symmetry at an interface with the first metal film. In this case, it is easy to improve the crystallinity of the Ni film.

(3) In (1) or (2), the crystallinity control film may include a ZnO film, a GaN film, a Ti film, a TiN film, an Al film, an AlSiCu film, or an AlN film. In this case, it is easy to improve the crystallinity of the Ni film.

(4) In (1) to (3), the gate electrode may include, in plan view in the direction perpendicular to the top surface of the substrate, a first region overlapping the first opening, a second region extending from the first region toward the source electrode in a horizontal direction, and a third region extending from the first region toward the drain electrode in the horizontal direction. The crystallinity control film may be disposed in at least a portion of the second region and a portion of the third region. In this case, electric field concentration in the vicinity of the gate electrode can be easily alleviated. In addition, it is possible to suppress a decrease in crystallinity of the first metal film and the second metal film in the second region and the third region.

(5) In (4), a full width at half maximum of an electron beam diffraction pattern of the second metal film in the second region and a full width at half maximum of an electron beam diffraction pattern of the second metal film in the third region may be 45 times or less a full width at half maximum of an electron beam diffraction pattern of the second metal film in the first region. In this case, it is particularly easy to reduce the electrical resistance of the gate electrode.

(6) In (4) or (5), an average crystal grain size of the second metal film in the second region and an average crystal grain size of the second metal film in the third region may be 60% or more of an average crystal grain size of the second metal film in the first region. In this case, it is particularly easy to reduce the electrical resistance of the gate electrode.

(7) In (1) to (6), a thickness of the crystallinity control film may be 10 nm to 30 nm. In this case, the crystallinity of the first metal film is easily improved while suppressing side etching in etching at the time of forming the crystallinity control film.

(8) In (1) to (7), a portion of the gate electrode above a top surface of the insulating layer may have a shape that becomes wider toward the insulating layer in cross-sectional view in a direction that is perpendicular to a direction in which the source electrode and the drain electrode are arranged and that is parallel to the top surface of the substrate. When a gate electrode is formed by a deposition method using a resist mask, the gate electrode is likely to have such a shape.

(9) In (1) to (8), the insulating layer may be an amorphous layer. In this case, leakage between the gate electrode and the semiconductor layer can be easily suppressed.

(10) A semiconductor device according to another aspect of the present disclosure includes a substrate, a semiconductor layer disposed on the substrate, an insulating layer disposed on the semiconductor layer and having a first opening formed therein, a gate electrode disposed on the insulating layer and in contact with the semiconductor layer via the first opening, and a source electrode and a drain electrode in ohmic contact with the semiconductor layer. The gate electrode includes a ZnO film disposed on the insulating layer and having a second opening formed such that an inner wall thereof extends to an inner wall of the first opening, a Ni film disposed on the ZnO film and in Schottky contact with the semiconductor layer via the inner walls, extending to each other, of the second opening and the first opening, and an Au film disposed on the Ni film and having a lower electrical resistance than the Ni film.

Since the Ni film is formed on the ZnO film, the crystallinity of the Ni film is improved as compared with the case where the Ni film is formed on the insulating layer so as to be in contact with the insulating layer. Since the crystallinity of the Au film is affected by the crystallinity of the Ni film, the crystallinity of the Au film is also improved. Thus, the electrical resistance of the gate electrode can be reduced. By reducing the electrical resistance of the gate electrode, it is possible to reduce a loss of a signal input to the gate electrode and to reduce deterioration of a high-frequency gain. Therefore, characteristics and reliability of the semiconductor device can be improved.

(11) A method of manufacturing a semiconductor device according to another aspect of the present disclosure includes forming a semiconductor layer on a substrate, forming a source electrode and a drain electrode in ohmic contact with the semiconductor layer, forming an insulating layer on the semiconductor layer, forming a crystallinity control film on the insulating layer, forming a second opening in the crystallinity control film, forming a first opening in the insulating layer such that an inner wall thereof extends to an inner wall of the second opening, forming a resist mask having a third opening with a larger opening width than the second opening and the first opening, forming a first metal film on the crystallinity control film via the third opening, the first metal film being in Schottky contact with the semiconductor layer via the inner walls, extending to each other, of the second opening and the first opening, forming a second metal film on the first metal film via the third opening, the second metal film having a lower electrical resistance than the first metal film, and removing the resist mask.

Since the first metal film is formed on the crystallinity control film, the crystallinity of the first metal film is improved as compared with the case where the first metal film is formed on the insulating layer so as to be in contact with the insulating layer. Since the crystallinity of the second metal film is affected by the crystallinity of the first metal film, the crystallinity of the second metal film is also improved. Thus, the electrical resistance of the gate electrode can be reduced. By reducing the electrical resistance of the gate electrode, it is possible to reduce a loss of a signal input to the gate electrode and to reduce deterioration of a high-frequency gain. Therefore, characteristics and reliability of the semiconductor device can be improved.

(12) In (11), a temperature of the substrate in forming the crystallinity control film may be 150° C. to 500° C.

(13) In (11) or (12), the first metal film and the second metal film may be formed by a vapor deposition method.

(14) In (11) to (13), a temperature of the substrate in forming the first metal film and forming the second metal film may be 80° C. or lower.

Details of Embodiments of Present Disclosure

Hereinafter, embodiments of the present disclosure will be described in detail, but the present disclosure is not limited thereto. It should be noted that in the specification and the drawings of the present application, the same reference numerals may be assigned to components having substantially the same function/configuration so that repetitive descriptions may be omitted.

Embodiments of the present disclosure relate to a semiconductor device including a high electron mobility transistor (HEMT) using a nitride semiconductor. FIG. 1 is a cross-sectional view of a semiconductor device according to an embodiment.

A semiconductor device 1 according to an embodiment includes a substrate 10, and a semiconductor stack part 20 including a plurality of nitride semiconductor layers and provided on substrate 10. Substrate 10 is, for example, an SiC substrate having a (0001) plane, and the stacking direction of semiconductor stack part 20 is, for example, the [0001] direction. Semiconductor stack part 20 includes a nucleation layer 12, a channel layer 14, a barrier layer 16, and a capping layer 18, which are formed in this order substrate 10. Nucleation layer 12 functions as a seed layer for channel layer 14. For example, nucleation layer 12 is an AlN layer, and a thickness of nucleation layer 12 is 5 nm to 20 nm. Channel layer 14 is epitaxially grown on nucleation layer 12, and functions as an electron transit layer. For example, channel layer 14 is an undoped GaN layer, and a thickness of channel layer 14 is 500 nm. Semiconductor stack part 20 is an example of a semiconductor layer.

Barrier layer 16 is epitaxially grown on channel layer 14 and functions as an electron supply layer. For example, barrier layer 16 is an AlGaN layer, an InAlN layer, or an InAlGaN layer, and a thickness of barrier layer 16 is 5 nm to 30 nm. The band gap of barrier layer 16 is larger than that of channel layer 14. When barrier layer 16 is an AlGaN layer, the Al composition of barrier layer 16 is, for example, 0.15 to 0.35. The conductivity type of barrier layer 16 may be n-type, or barrier layer 16 may be undoped. Barrier layer 16 and channel layer 14 may be in contact with each other, and a spacer layer (not shown) may be interposed between barrier layer 16 and channel layer 14. Barrier layer 16 and channel layer 14 are strained due to a difference in lattice constant therebetween. Due to this strain, a two dimensional electronic gas (2DEG) derived from the piezoelectric charge is generated in a region near channel layer 14 in the vicinity of the interface between barrier layer 16 and channel layer 14, and a channel region is formed.

Capping layer 18 is epitaxially grown on barrier layer 16. For example, capping layer 18 is a GaN layer, and a thickness of capping layer 18 is 5 nm. For example, the conductivity type of capping layer 18 is n-type.

The semiconductor device further includes a source electrode 22 and a drain electrode 24. Source electrode 22 and drain electrode 24 are arranged along the upper surface of substrate 10. Source electrode 22 and drain electrode 24 are provided on capping layer 18 and in ohmic contact with semiconductor stack part 20. Source electrode 22 and drain electrode 24 are formed by heat-treating (alloying) a tantalum (Ta) layer and an aluminum (Al) layer and a Ta layer, which are provided in this order over semiconductor stack part 20. A Ti layer may be provided instead of the Ta layer.

Semiconductor device 1 further includes an SiN passivation film 26. For example, a thickness of SiN passivation film 26 is 20 nm to 100 nm. SiN passivation film 26 is an amorphous film. SiN passivation film 26 is provided on source electrode 22, drain electrode 24, and capping layer 18 to cover source electrode 22, drain electrode 24, and capping layer 18. An opening 26G is formed in SiN passivation film 26, and capping layer 18 is exposed from SiN passivation film 26 through opening 26G. SiN passivation film 26 is an example of an insulating layer. Opening 26G is an example of a first opening.

Figure 2:
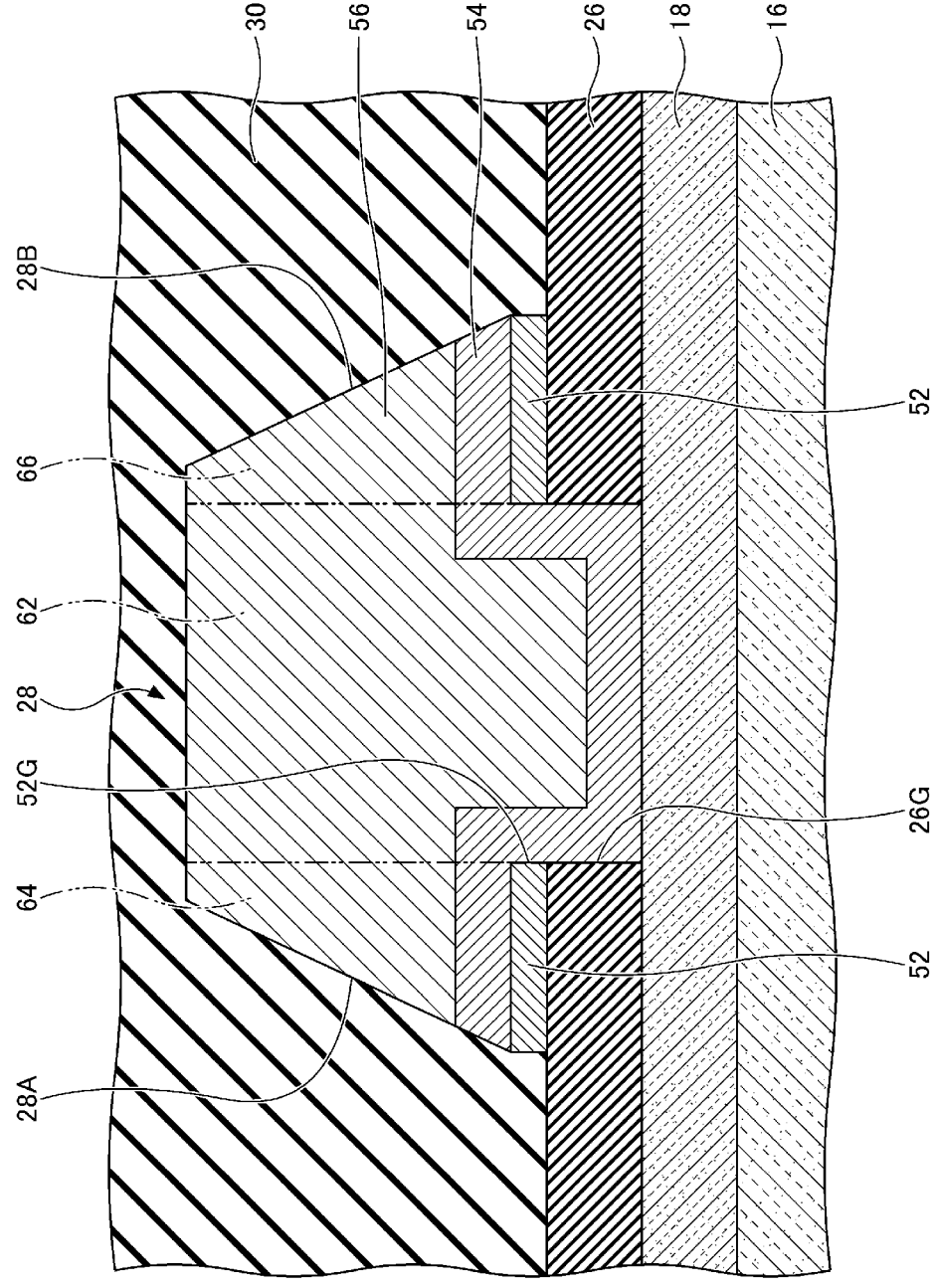
FIG. 2 is an enlarged cross-sectional view of a gate electrode.

Semiconductor device 1 further includes a gate electrode 28. Gate electrode 28 is provided on SiN passivation film 26 between source electrode 22 and drain electrode 24. Here, gate electrode 28 will be described in detail. FIG. 2 is an enlarged cross-sectional view of gate electrode 28.

Gate electrode 28 covers opening 26G and is in contact with semiconductor stack part 20 through opening 26G. Gate electrode 28 includes a zinc oxide (ZnO) film 52, a nickel (Ni) film 54, and a gold (Au) film 56.

ZnO film 52 is provided on SiN passivation film 26, and an opening 52G is formed in ZnO film 52. The inner wall portion of opening 52G and the inner wall portion of opening 26G are formed smoothly and continuously from opening 52G toward opening 26G in a plan view from a direction perpendicular to the upper surface of the substrate. In other words, opening 52G is formed such that its inner wall is continuous with the inner wall of opening 26G. For example, a thickness of ZnO film 52 is 10 nm to 30 nm. ZnO film 52 is an example of a crystallinity control film.

Ni film 54 is provided on ZnO film 52 and is in Schottky contact with semiconductor stack part 20 through opening 52G and opening 26G. Ni film 54 is in contact with ZnO film 52. Ni film 54 covers opening 52G and opening 26G. Ni film 54 runs on ZnO film 52 from the upper surface of semiconductor stack part 20 in opening 26G through the inner wall surfaces of opening 26G and opening 52G which are continuous with each other. For example, a thickness of Ni film 54 is 1 nm to 200 nm. Ni film 54 is an example of a first metal film.

Au film 56 is provided on Ni film 54 from the inside of openings 26G and 52G to above of SiN passivation film 26. Au film 56 is in contact with Ni film 54. For example, a thickness of Au film 56 is 300 nm to 800 nm. The electrical resistance of Au film 56 is lower than that of Ni film 54. Au film 56 is an example of a second metal film.

Gate electrode 28 includes a first region 62 overlapping opening 26G, a second region 64 extending from first region 62 toward source electrode 22 in the horizontal direction, and a third region 66 extending from first region 62 toward drain electrode 24 in the horizontal direction in plan view in the direction perpendicular to the top surface of the substrate. Second region 64 and third region 66 are formed on SiN passivation film 26. The pair of side surfaces 28A and 28B of gate electrode 28 on SiN passivation film 26 are inclined with respect to the upper surface of SiN passivation film 26, and come closer to each other as the distance from semiconductor stack part 20 increases. Thus, a portion of gate electrode 28 above the upper surface of SiN passivation film 26 has a substantially trapezoidal shape. That is, a portion of gate electrode 28 above the upper surface of SiN passivation film 26 has a shape that becomes wider toward SiN passivation film 26 in a cross-sectional view in a direction that is perpendicular to the direction in which source electrode 22 and drain electrode 24 are arranged and that is parallel to the top surface of substrate 10. The pair of side surfaces 28A and 28B of gate electrode 28 are mainly composed of Au film 56. A side surface 28A is a side surface near source electrode 22, and a side surface 28B is a side surface near drain electrode 24.

Semiconductor device 1 further comprises an insulating layer 30. Insulating layer 30 covers gate electrode 28. Insulating layer 30 is made of an Si-containing insulating material and is, for example, an SiN layer, an $SiO_2$ layer, or an SiON layer. For example, a thickness of insulating layer 30 is 20 nm to 400 nm. Openings 32 and 34 are formed in SiN passivation film 26 and insulating layer 30. Source electrode 22 is exposed from an opening 32, and drain electrode 24 is exposed from an opening 34. A wiring (not shown) connected to source electrode 22 is provided in opening 32, and a wiring (not shown) connected to drain electrode 24 is provided in opening 34.

Here, a method of manufacturing semiconductor device 1 according to the embodiment will be described. FIGS. 3 to 14 are cross-sectional view illustrating a method of manufacturing semiconductor device 1 according to the embodiment.

Figure 3:
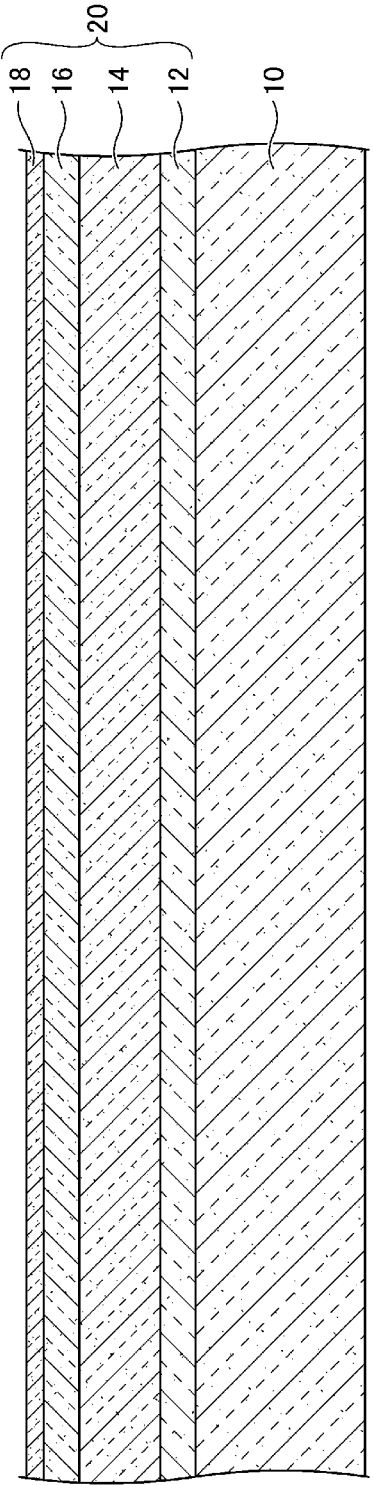
FIG. 3 is a cross-sectional view (part 1) illustrating a method of manufacturing a semiconductor device according to an embodiment.

First, as shown in FIG. 3, semiconductor stack part 20 including a plurality of nitride semiconductor layers is formed on substrate 10 by metal organic chemical vapor deposition (MOCVD). Specifically, first, nucleation layer 12 is grown on substrate 10. When nucleation layer 12 is an AlN layer, for example, the source gases are trimethylaluminum (TMA) and ammonia ($NH_3$), and the temperature of substrate 10 in forming nucleation layer 12 is 1100° C. Next, channel layer 14 is grown on nucleation layer 12. When channel layer 14 is a GaN layer, for example, the source gas is trimethylgallium (TMG) and $NH_3$, and the temperature of substrate 10 in forming channel layer 14 is 1050° C. Next, barrier layer 16 is grown on channel layer 14. When barrier layer 16 is an AlGaN layer, for example, the source gases are TMA, TMG, and $NH_3$, and the temperature of substrate 10 in forming barrier layer 16 is 1050° C. Then, capping layer 18 is grown on barrier layer 16. When capping layer 18 is a GaN layer, for example, the source gases are TMG and $NH_3$, and the temperature of substrate 10 in forming capping layer 18 is 1050° C.

Figure 4:
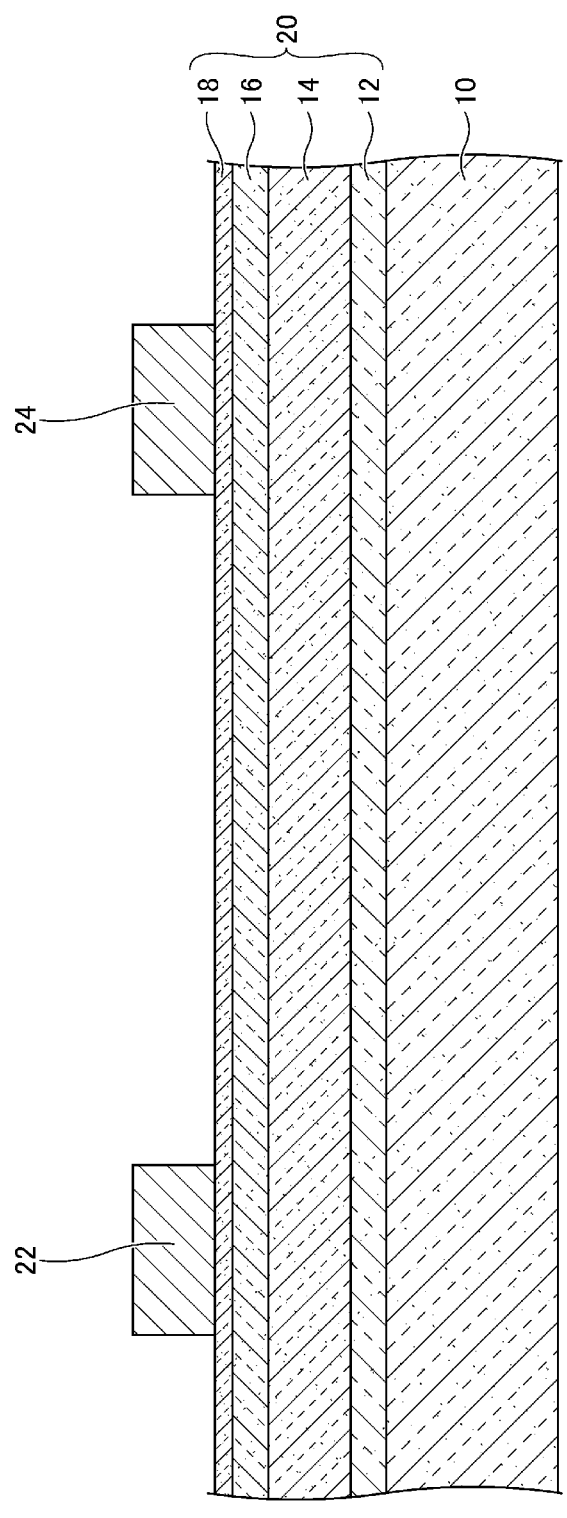
FIG. 4 is a cross-sectional view (part 2) illustrating the method of manufacturing the semiconductor device according to the embodiment.

Next, as shown in FIG. 4, source electrode 22 and drain electrode 24 are formed on capping layer 18 by a vapor deposition method using lithography and lift-off techniques. Thereafter, alloying is performed by heat treatment at a temperature of 500° C. to 600° C.

Figure 5:
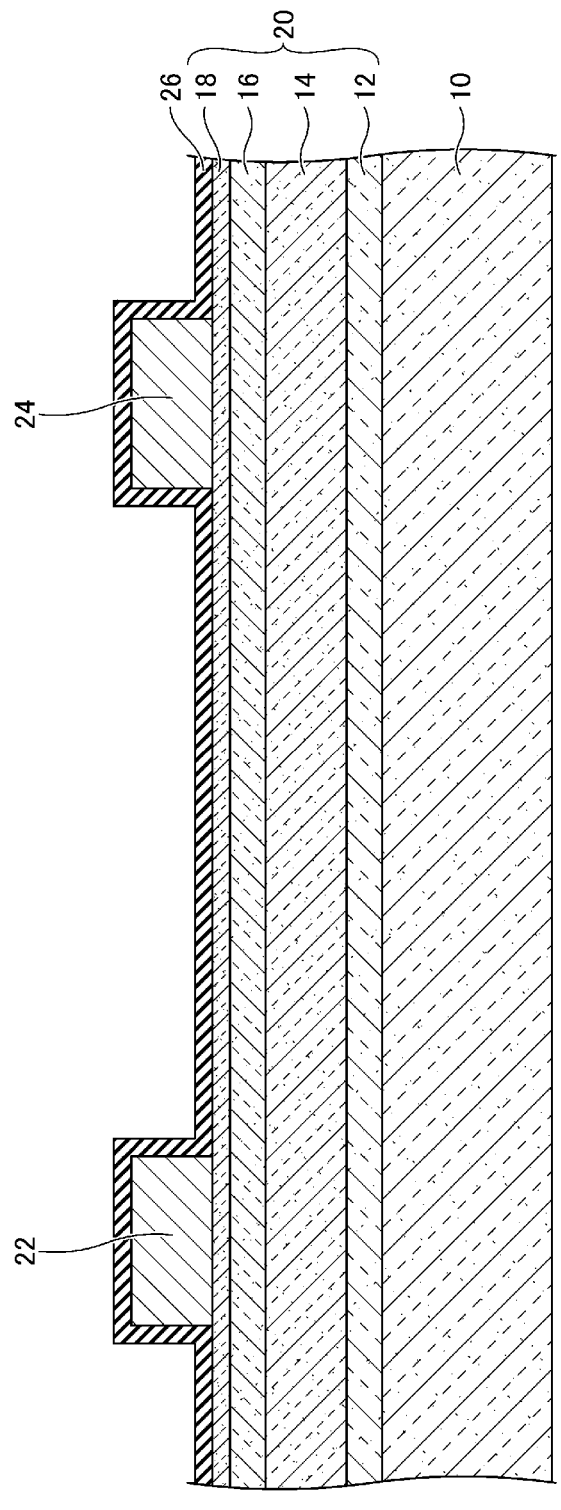
FIG. 5 is a cross-sectional view (part 3) illustrating the method of manufacturing the semiconductor device according to the embodiment.

Next, as shown in FIG. 5, SiN passivation film 26 covering source electrode 22, drain electrode 24, and semiconductor stack part 20 is formed. SiN passivation film 26 can be formed by, for example, a plasma CVD method or a sputtering method. For example, when SiN passivation film 26 is formed by a plasma CVD method, the temperature of substrate 10 is 250° C. to 350° C.

Figure 6:
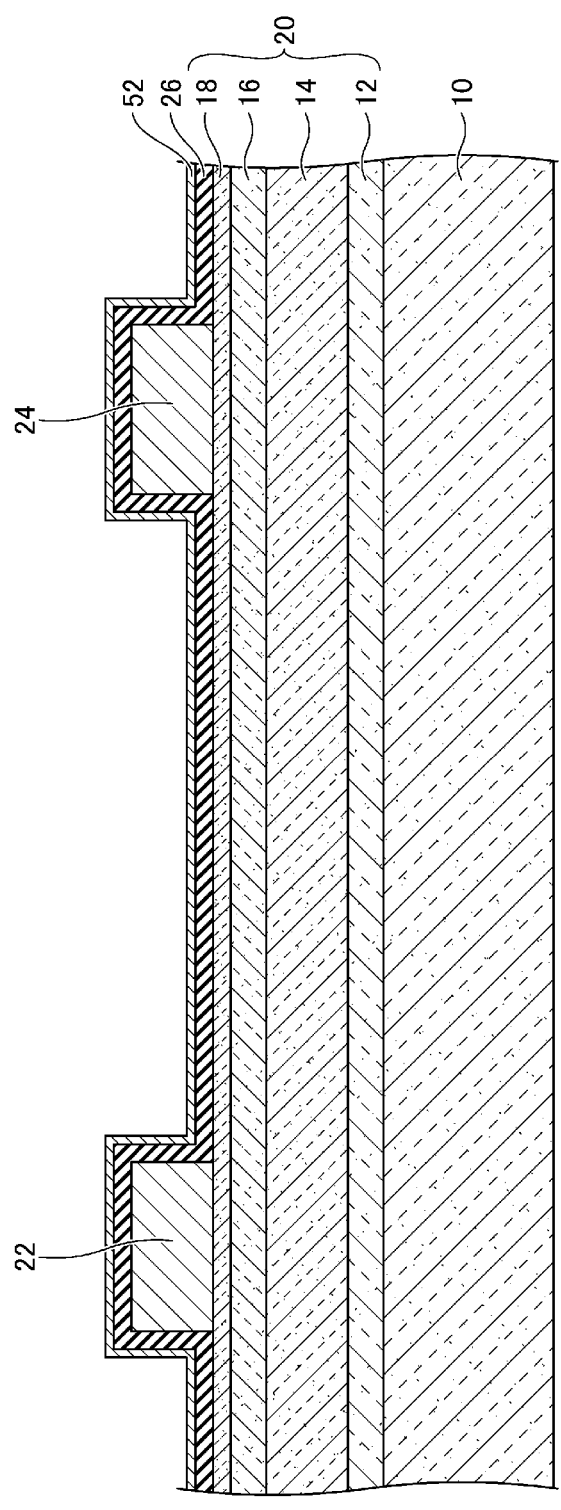
FIG. 6 is a cross-sectional view (part 4) illustrating the method of manufacturing the semiconductor device according to the embodiment.

Next, as shown in FIG. 6, ZnO film 52 is formed on SiN passivation film 26. ZnO film 52 can be formed by, for example, a sputtering method, a plasma CVD method, or an atomic layer deposition (ALD) method. The temperature (growth temperature) of substrate 10 when ZnO film 52 is formed is, for example, 150° C. to 500° C. By setting the growth temperature to 150° C. to 500° C., the c-axis orientation of ZnO film 52 is easily improved. The growth temperature may be 200° C. to 450° C., and maybe 250° C. to 400° C.

Figure 7:
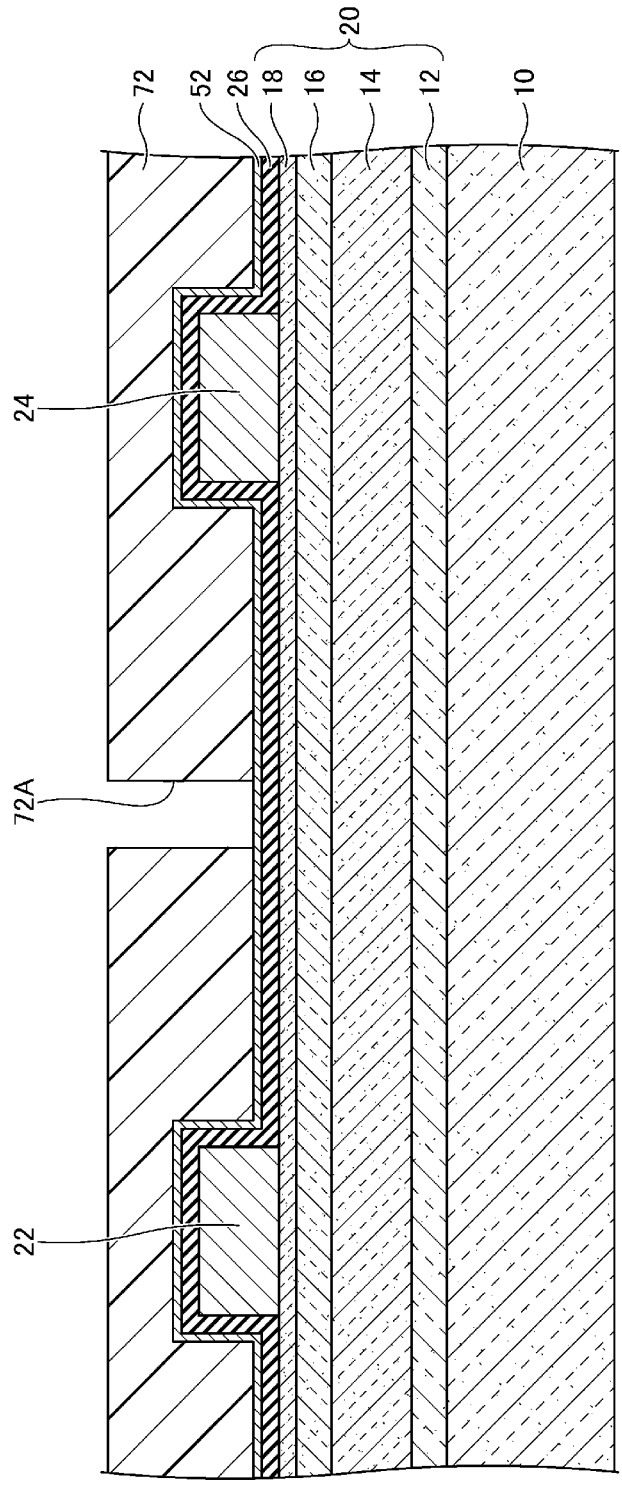
FIG. 7 is a cross-sectional view (part 5) illustrating the method of manufacturing the semiconductor device according to the embodiment.

Next, as shown in FIG. 7, a resist mask 72 having an opening 72A in a region where opening 26G is to be formed is formed on ZnO film 52. Resist mask 72 can be formed by, for example, applying, exposing, and developing a resist.

Figure 8:
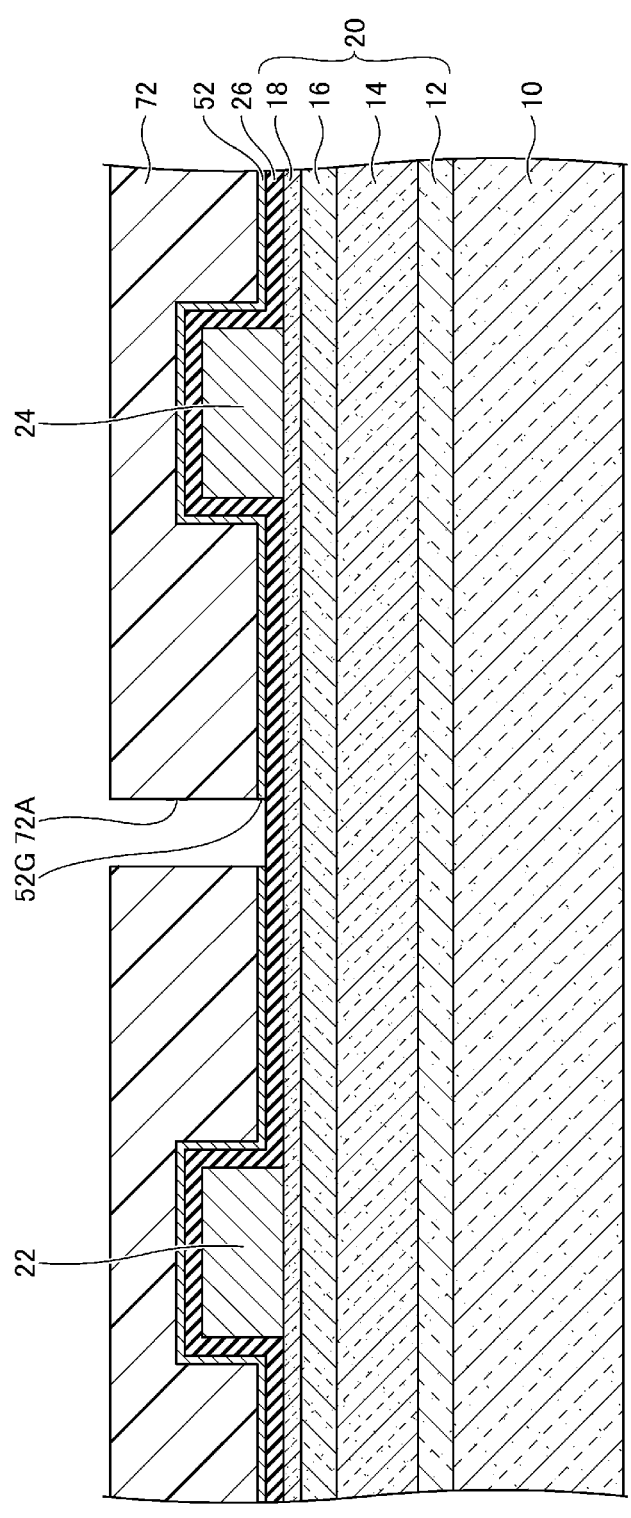
FIG. 8 is a cross-sectional view (part 6) illustrating the method of manufacturing the semiconductor device according to the embodiment.

Next, as shown in FIG. 8, a portion of ZnO film 52 exposed from opening 72A is etched to form opening 52G in ZnO film 52. The etching of ZnO film 52 may be performed by anisotropic dry etching using a chlorine-based gas. Although side etching may occur, wet etching using HCl, $HNO_3$, $CH_3COOH$, or the like may be performed.

ZnO film 52 may be etched by a developing solution used for forming resist mask 72, for example, tetramethylammonium hydroxide (TMAH).

Figure 9:
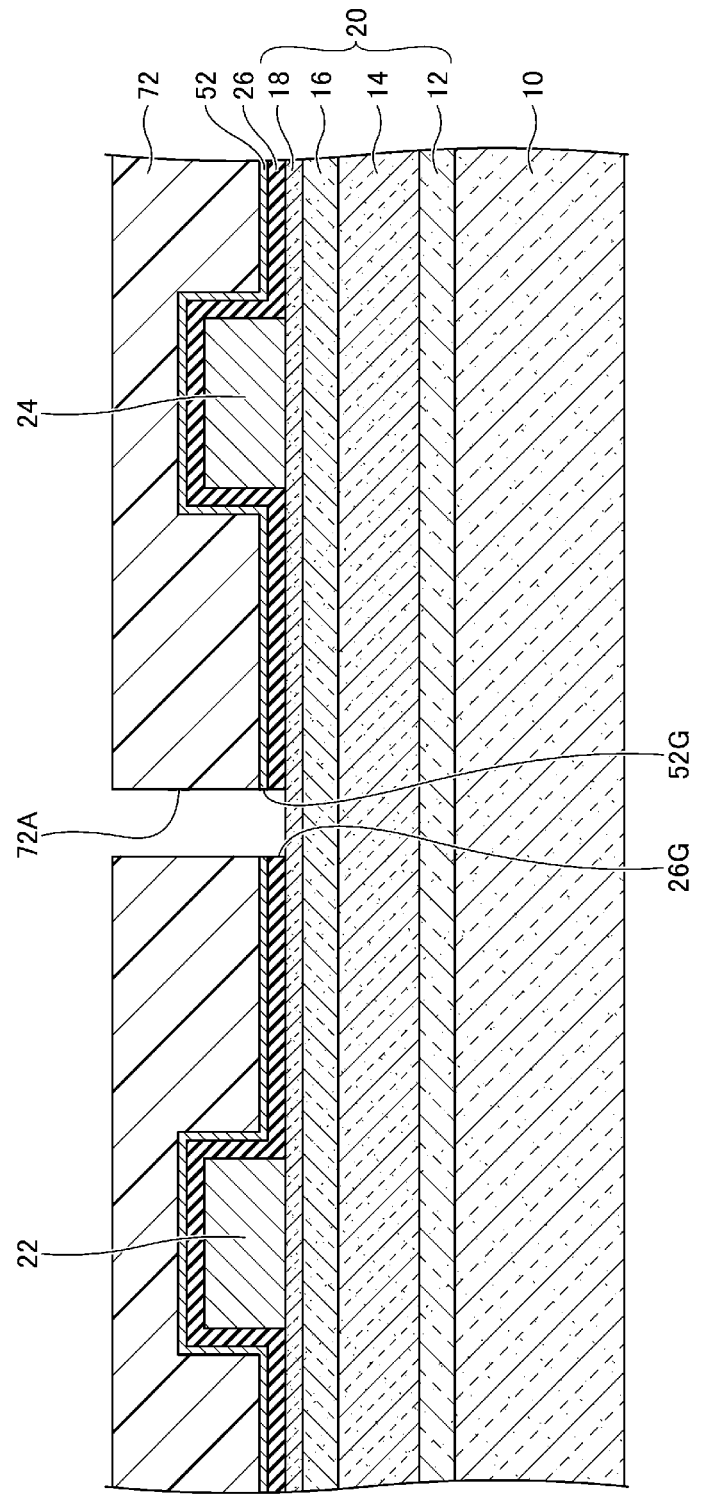
FIG. 9 is a cross-sectional view (part 7) illustrating the method of manufacturing the semiconductor device according to the embodiment.

Next, as shown in FIG. 9, portions of SiN passivation film 26 exposed from openings 72A and 52G are etched to form openings 26G in SiN passivation film 26. Opening 26G is formed such that its inner wall is continuous with the inner wall of opening 52G. The etching of SiN passivation film 26 may be anisotropic dry etching using a fluorine-based gas.

Figure 10:
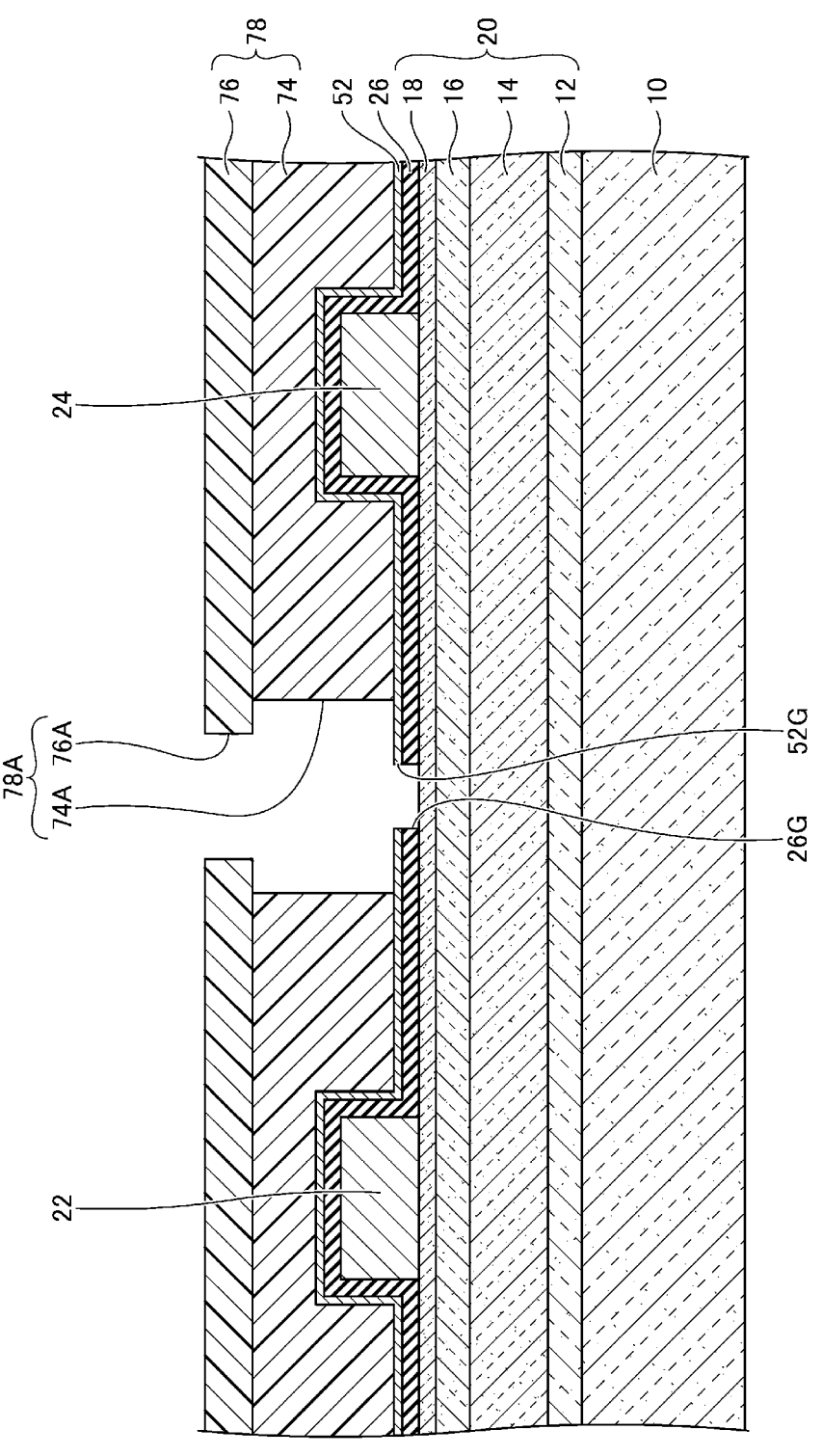
FIG. 10 is a cross-sectional view (part 8) illustrating the method of manufacturing the semiconductor device according to the embodiment.

Next, as shown in FIG. 10, resist mask 72 is removed, and then a resist mask 74 having an opening 74A and a resist mask 76 having an opening 76A are formed on ZnO film 52. In the cross-sectional configuration shown in FIG. 10, the opening width of opening 76A in the horizontal direction is greater than the opening widths of opening 52G and opening 26G in the horizontal direction. The opening width of opening 74A in the horizontal direction is greater than the opening width of opening 76A in the horizontal direction. In forming of resist mask 74 and resist mask 76, a resist for resist mask 74 is applied, and then a resist for resist mask 76 is applied. Next, opening 76A is formed in the resist for resist mask 76 so that the opening width thereof is larger than the opening widths of opening 52G and opening 26G, and opening 74A is formed in the resist for resist mask 74 so that the opening width thereof is larger than the opening width of opening 76A. Resist mask 74 and resist mask 76 are included in a resist mask 78, and opening 74A and opening 76A are included in an opening 78A. Opening 78A is an example of a third opening.

Figure 11:
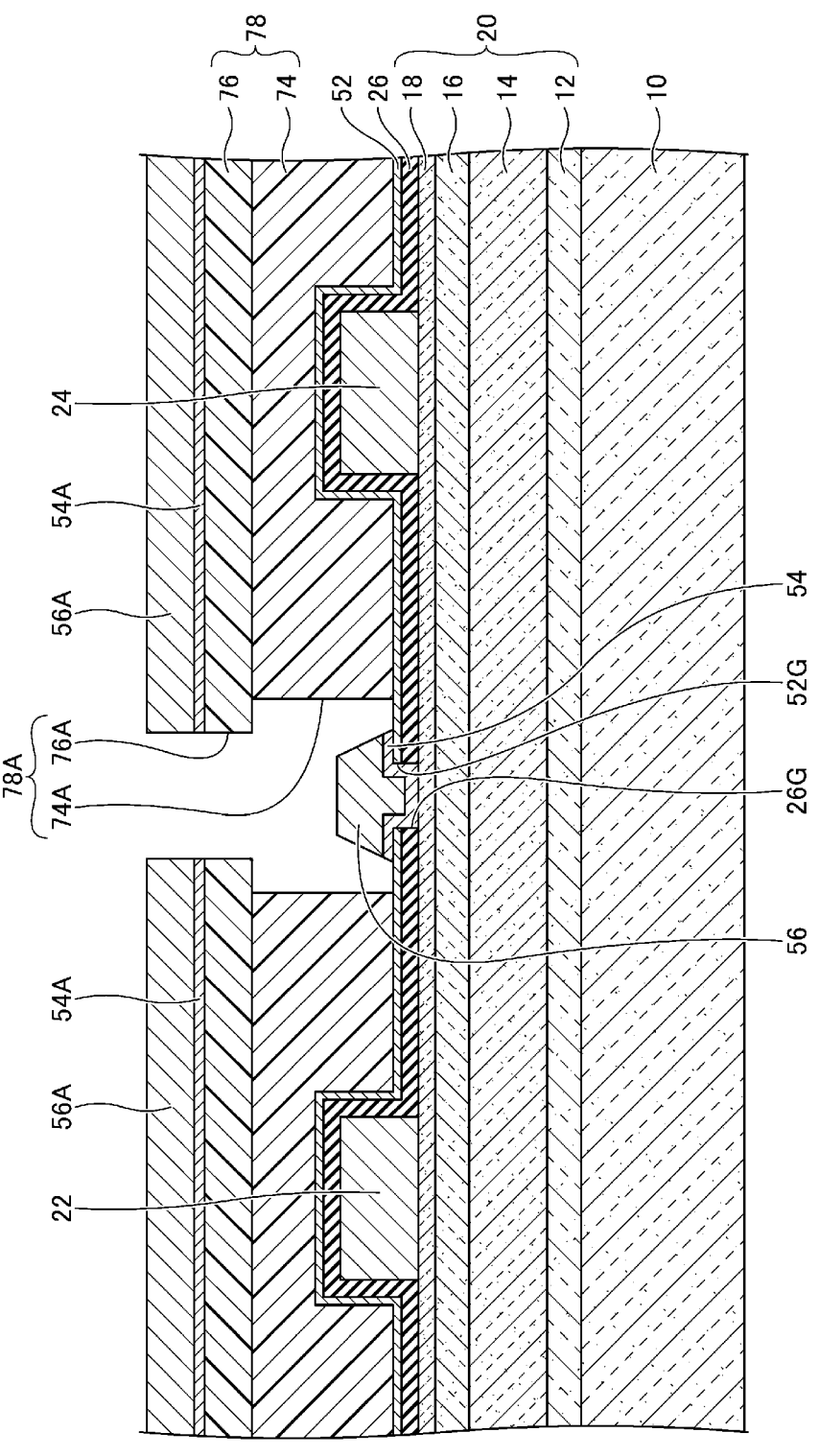
FIG. 11 is a cross-sectional view (part 9) illustrating the method of manufacturing the semiconductor device according to the embodiment.

Next, as shown in FIG. 11, Ni film 54 and Au film 56 are formed in this order through opening 76A and opening 74A by a vapor deposition method. In order to avoid deterioration of resist mask 76 and resist mask 74, the temperature of substrate 10 when Ni film 54 and Au film 56 are formed may be 80° C. or lower, and may be 70° C. or lower. Ni film 54 is formed on ZnO film 52 and is in Schottky contact with semiconductor stack part 20 through openings 52G and 26G. Au film 56 is formed on Ni film 54 from the inside of opening 26G and opening 52G to above SiN passivation film 26. When Ni film 54 is formed, a Ni film 54A is formed on resist mask 76, and when Au film 56 is formed, an Au film 56A is formed on Ni film 54A.

Figure 12:
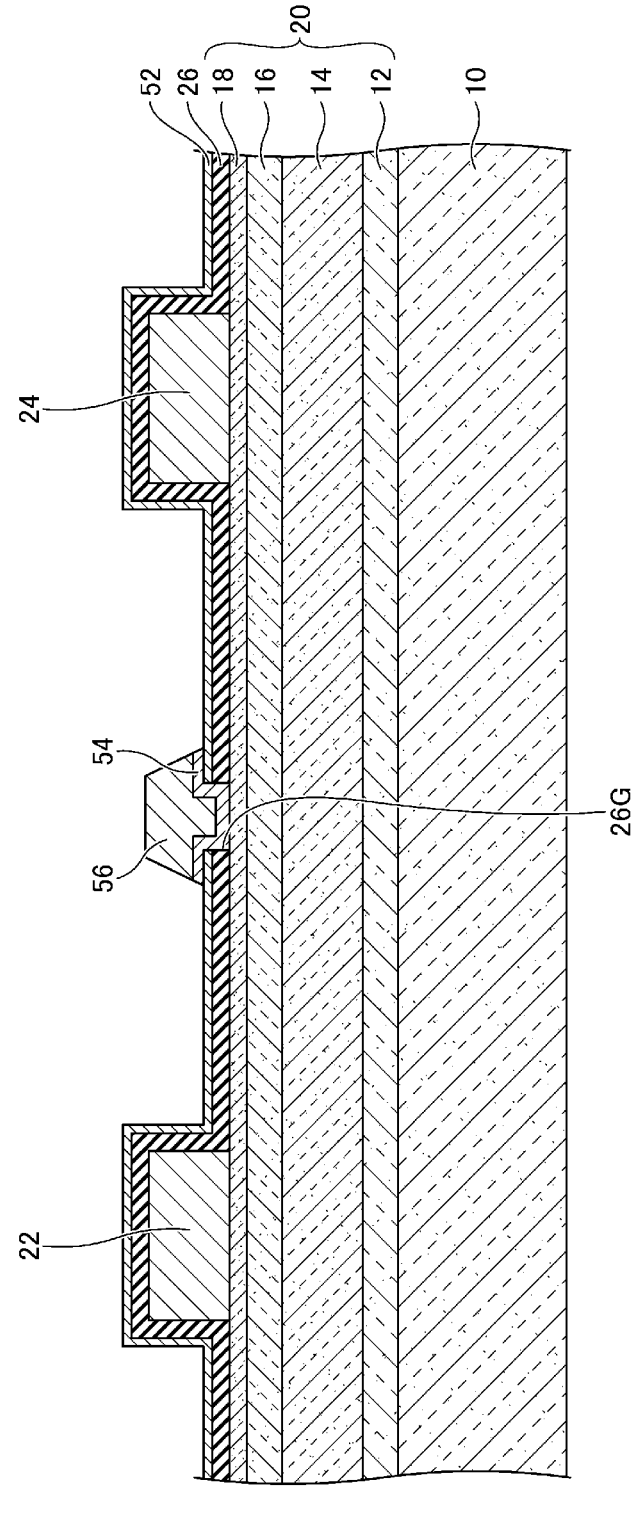
FIG. 12 is a cross-sectional view (part 10) illustrating the method of manufacturing the semiconductor device according to the embodiment.

Next, as shown in FIG. 12, resist mask 76 and resist mask 74 are removed. Along with the removal of resist mask 76 and resist mask 74, Ni film 54A and Au film 56A are also removed. That is, lift-off is performed.

Figure 13:
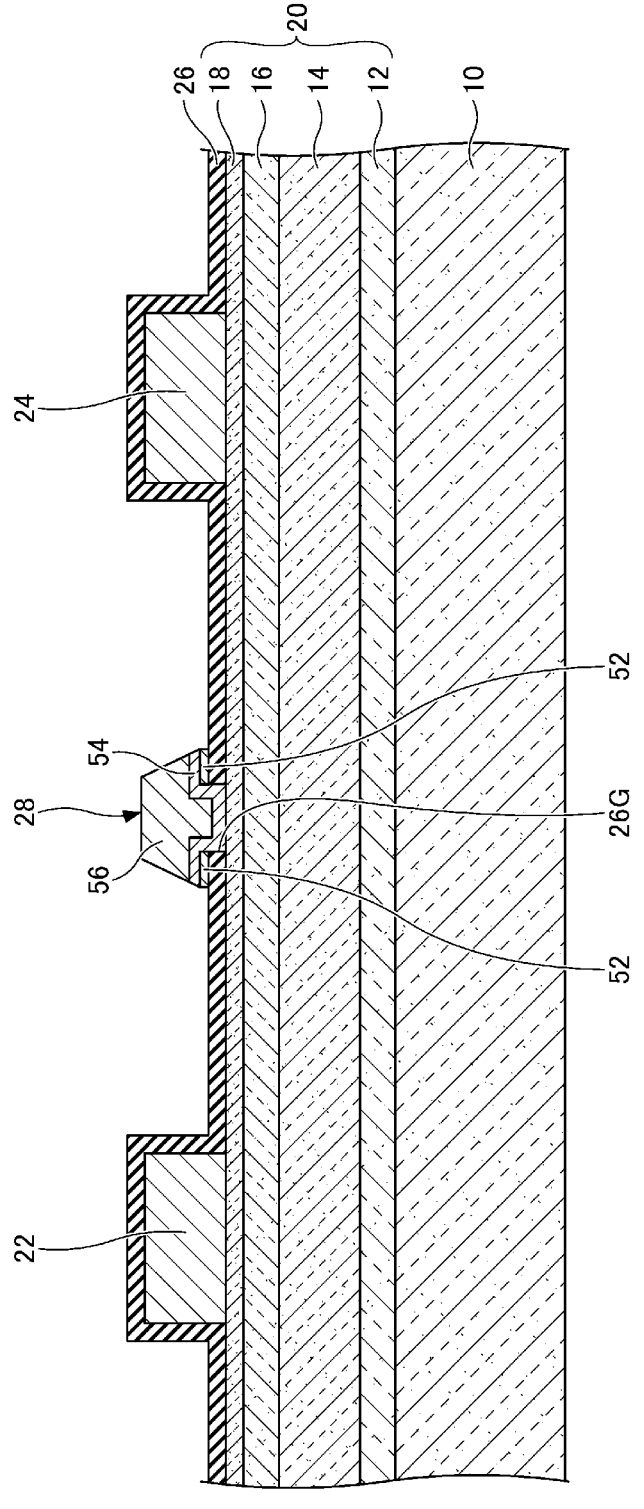
FIG. 13 is a cross-sectional view (part 11) illustrating the method of manufacturing the semiconductor device according to the embodiment.

Next, as shown in FIG. 13, the portions of ZnO film 52 exposed from Au film 56 and Ni film 54 are removed. ZnO film 52 is removed by, for example, wet etching. For example, a diluted solution of hydrochloric acid or sulfuric acid can be used to remove ZnO film 52. As a result, gate electrode 28 including ZnO film 52, Ni film 54, and Au film 56 is formed. Since Ni film 54 and Au film 56 are formed using resist mask 74 and resist mask 76, a portion of gate electrode 28 above the upper surface of SiN passivation film 26 has a substantially trapezoidal shape. That is, a portion of gate electrode 28 above the upper surface of SiN passivation film 26 has a shape that becomes wider toward SiN passivation film 26 in a cross-sectional view in a direction that is perpendicular to a direction in which source electrode 22 and drain electrode 24 are arranged and that is parallel to the top surface of substrate 10.

Figure 14:
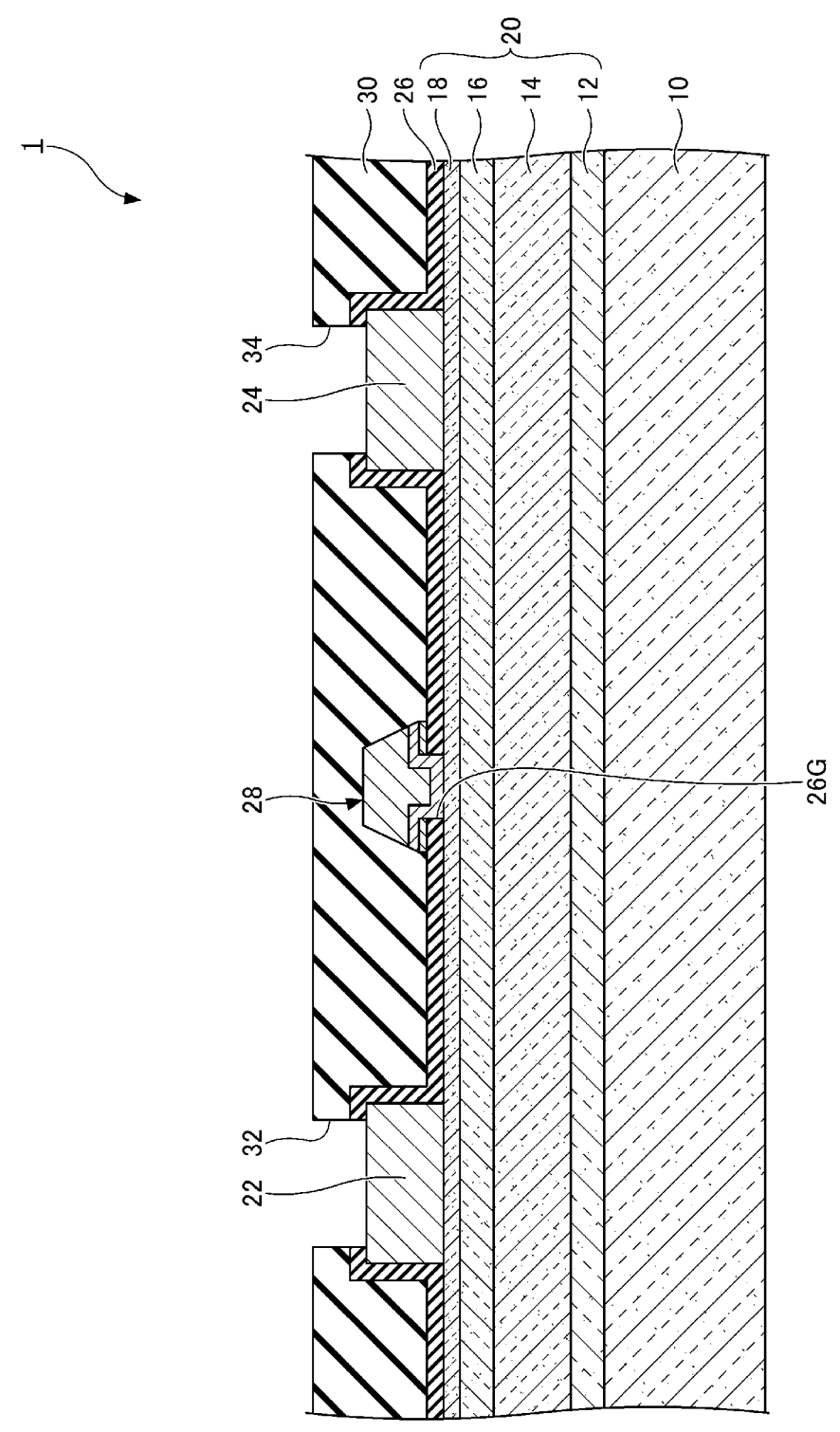
FIG. 14 is a cross-sectional view (part 12) illustrating the method of manufacturing the semiconductor device according to the embodiment.

Next, as shown in FIG. 14, insulating layer 30 covering gate electrode 28 and SiN passivation film 26 is formed. Insulating layer 30 can be formed by, for example, a plasma CVD method or a sputtering method. The temperature of substrate 10 in forming insulating layer 30 is, for example, 250° C. to 350° C. Next, openings 32 and 34 are formed in insulating layer 30 and SiN passivation film 26. Source electrode 22 is exposed from opening 32, and drain electrode 24 is exposed from opening 34.

In this manner, semiconductor device 1 according to the embodiment can be manufactured.

In the embodiment of the present disclosure, Ni film 54 in Schottky contact with semiconductor stack part 20 is formed on ZnO film 52 which is a crystallinity control film, and the crystallinity of Ni film 54 is improved as compared with the case where Ni film 54 is formed on SiN passivation film 26 so as to be in contact with SiN passivation film 26. Further, the crystallinity of Au film 56 is affected by the crystallinity of Ni film 54. Thus, according to the embodiment of the present disclosure, the crystallinity of Au film 56 is also improved as compared with the case where Ni film 54 is formed on SiN passivation film 26 so as to be in contact with SiN passivation film 26. Thus, according to the embodiment of the present disclosure, the electrical resistance of gate electrode 28 can be reduced. By reducing the electrical resistance of gate electrode 28, the loss of the signal input to gate electrode 28 can be reduced, and the deterioration of the high-frequency gain can be reduced. Therefore, the characteristics and reliability of semiconductor device 1 can be improved.

In the embodiment of the present disclosure, semiconductor stack part 20 includes a nitride semiconductor layer, and Ni film 54 is in Schottky contact with the nitride semiconductor layer. The atomic arrangement of Ni film 54 at the interface with ZnO film 52 is six fold symmetry, and the atomic arrangement of ZnO film 52 at the interface with Ni film 54 is six fold symmetry. Therefore, it is easy to improve the crystallinity of Ni film 54.

The ZnO film as the crystallinity control film may or may not be doped with an impurity. When the impurity is doped, the concentration thereof is, for example, 1 atomic % to 10 atomic %. Examples of the impurity doped into the ZnO film include B, Al, Ga, and In. The crystallinity control film is not limited to a ZnO film, and may include a GaN film, a Ti film, a TiN film, an Al film, an AlSiCu film, or an AlN film. The atomic arrangement of these films at the interface with the first metal film is also six fold symmetry. The GaN film may or may not be doped with an impurity. Examples of the impurity doped into the GaN film include Si and Ge.

Since gate electrode 28 includes first region 62, second region 64, and third region 66, electric field concentration in the vicinity of gate electrode 28 can be alleviated. In addition, since ZnO film 52 is provided in second region 64 and third region 66, it is possible to suppress a decrease in crystallinity of Ni film 54 and Au film 56 in second region 64 and third region 66.

Since SiN passivation film 26 is an amorphous film, leakage between gate electrode 28 and semiconductor stack part 20 can be easily suppressed.

A barrier metal film such as a Pd film, a Pt film, or a Ru film may be provided between Ni film 54 and Au film 56. A thickness of the barrier metal film is, for example, 5 nm to 100 nm. A Ta film, a TaN film, an Hf film, an HfN film, a Zr film, a ZrN film, a W film, a WN film, or the like may be provided on Au film 56.

In the present disclosure, the full width at half maximum of the electron beam diffraction pattern of the second metal film in the second region and the full width at half maximum of the electron beam diffraction pattern of the second metal film in the third region may be 45 times or less, may be 30 times or less, and may be 20 times or less of the full width at half maximum of the electron beam diffraction pattern of the second metal film in the first region. As the full width at half maximum of the electron beam diffraction pattern of the second metal film in the second region and the full width at half maximum of the electron beam diffraction pattern of the second metal film in the third region are smaller, it is easier to reduce the electrical resistance of the gate electrode.

The full width at half maximum of the electron beam diffraction pattern of the second metal film can be measured as follows. A focused ion beam (FIB) is used to slice the cross section of gate electrode 28 to expose the cross section. A thickness of the thin piece may be about 50 nm to 200 nm. Using a transmission electron microscope (TEM), an electron beam is perpendicularly incident on the cross section of gate electrode 28. Since the second metal film has crystallinity, the electron beams transmitted through the sample (thin piece) strengthen each other in a specific direction corresponding to the periodicity of the crystal to form an image in a spot shape on a detector, and an electron beam diffraction pattern is obtained. An intensity profile of a 111 diffraction point or a −1−1−1 diffraction point is extracted from the electron beam diffraction pattern, and a full width at half maximum thereof is measured.

In the first region, the first metal film is in contact with the nitride semiconductor film, and in the second region and the third region, SiN passivation film 26 is positioned between the first metal film and the nitride semiconductor film. An electron beam diffraction pattern is acquired for each of the second metal film in the first region, the second metal film in the second region, and the second metal film in the third region, and the full width at half maximum is measured. Thus, the (111) orientations of regions having different bases can be quantified and compared.

In the present disclosure, the average crystal grain size of the second metal film in the second region and the average crystal grain size of the second metal film in the third region may be 60% or more, may be 70% or more, and may be 80% or more of the average crystal grain size of the second metal film in the first region. As the average crystal grain size of the second metal film in the second region and the average crystal grain size of the second metal film in the third region are larger, interdiffusion between the first metal film and the second metal film is more easily suppressed, and the electrical resistance of the gate electrode is more easily reduced.

The average crystal grain size of the second metal film can be measured using, for example, an atomic force microscope.

In the present disclosure, a thickness of the crystallinity control film may be from 10 nm to 30 nm, and may be from 15 nm to 25 nm. When the crystallinity control film is excessively thin, it may be difficult to improve the crystallinity of the first metal film. In addition, when the crystallinity control film is excessively thick, side etching may occur during etching of the crystallinity control film.

Although the embodiments have been described in detail above, the present invention is not limited to the specific embodiments, and various modifications and changes can be made within the scope described in the claims.

What is claimed is:

1. A semiconductor device comprising:
a substrate;
a semiconductor layer disposed on the substrate;
an insulating layer disposed on the semiconductor layer and having a first opening formed therein;
a gate electrode disposed on the insulating layer and in contact with the semiconductor layer via the first opening; and
a source electrode and a drain electrode in ohmic contact with the semiconductor layer,
wherein the gate electrode includes:
a crystallinity control film disposed on the insulating layer and having a second opening formed such that an inner wall thereof extends to an inner wall of the first opening toward the substrate in plan view in a direction perpendicular to a top surface of the substrate;
a first metal film disposed on the crystallinity control film and in Schottky contact with the semiconductor layer via the inner walls, extending to each other, of the second opening and the first opening; and
a second metal film disposed on the first metal film and having a lower electrical resistance than the first metal film, and
wherein the crystallinity control film includes a ZnO film, a GaN film, a Ti film, a TiN film, an Al film, an AlSiCu film, or an AlN film.

2. The semiconductor device according to claim 1, wherein the crystallinity control film includes a ZnO film, a GaN film, a Ti film, a TiN film, an Al film, an AlSiCu film, or an AlN film.

3. The semiconductor device according to claim 1, wherein
the gate electrode includes, in plan view in the direction perpendicular to the top surface of the substrate:
a first region overlapping the first opening;
a second region extending from the first region toward the source electrode in a horizontal direction; and
a third region extending from the first region toward the drain electrode in the horizontal direction, and
the crystallinity control film is disposed in at least a portion of the second region and a portion of the third region.

4. The semiconductor device according to claim 3, wherein a full width at half maximum of an electron beam diffraction pattern of the second metal film in the second region and a full width at half maximum of an electron beam diffraction pattern of the second metal film in the third region are 45 times or less a full width at half maximum of an electron beam diffraction pattern of the second metal film in the first region.

5. The semiconductor device according to claim 3, wherein an average crystal grain size of the second metal film in the second region and an average crystal grain size of the second metal film in the third region are 60% or more of an average crystal grain size of the second metal film in the first region.

6. The semiconductor device according to claim 1, wherein a thickness of the crystallinity control film is 10 nm to 30 nm.

7. The semiconductor device according to claim 1, wherein a portion of the gate electrode above a top surface of the insulating layer has a shape that becomes wider toward the insulating layer in cross-sectional view in a direction that is perpendicular to a direction in which the source electrode and the drain electrode are arranged and that is parallel to the top surface of the substrate.

8. The semiconductor device according to claim 1, wherein the insulating layer is an amorphous layer.

9. A semiconductor device comprising:
a substrate;
a semiconductor layer disposed on the substrate;
an insulating layer disposed on the semiconductor layer and having a first opening formed therein;
a gate electrode disposed on the insulating layer and in contact with the semiconductor layer via the first opening; and
a source electrode and a drain electrode in ohmic contact with the semiconductor layer,
wherein the gate electrode includes:
a ZnO film disposed on the insulating layer and having a second opening formed such that an inner wall thereof extends to an inner wall of the first opening;
a Ni film disposed on the ZnO film and in Schottky contact with the semiconductor layer via the inner walls, extending to each other, of the second opening and the first opening; and
an Au film disposed on the Ni film and having a lower electrical resistance than the Ni film.

10. A semiconductor device comprising:
a substrate;
a semiconductor layer disposed on the substrate;
an insulating layer disposed on the semiconductor layer and having a first opening formed therein;
a gate electrode disposed on the insulating layer and in contact with the semiconductor layer via the first opening; and
a source electrode and a drain electrode in ohmic contact with the semiconductor layer,
wherein the gate electrode includes:
a crystallinity control film disposed on the insulating layer and having a second opening formed such that an inner wall thereof extends to an inner wall of the first opening toward the substrate in plan view in a direction perpendicular to a top surface of the substrate,
a first metal film disposed on the crystallinity control film and in Schottky contact with the semiconductor layer via the inner walls, extending to each other, of the second opening and the first opening and
a second metal film disposed on the first metal film and having a lower electrical resistance than the first metal film, and
wherein a thickness of the crystallinity control film is 10 nm to 30 nm and the crystallinity control film includes a ZnO film, a GaN film, a Ti film, a TiN film, an Al film, an AlSiCu film, or an AlN film.

11. The semiconductor device according to claim 1, wherein the semiconductor layer includes a nitride semiconductor layer, the first metal film is a Ni film, and the crystallinity control film has an atomic arrangement with six-fold symmetry at an interface with the first metal film.

* * * * *